US006285054B1

(12) United States Patent
Liu et al.

(10) Patent No.: US 6,285,054 B1
(45) Date of Patent: Sep. 4, 2001

(54) TRENCHED GATE NON-VOLATILE SEMICONDUCTOR DEVICE WITH THE SOURCE/DRAIN REGIONS SPACED FROM THE TRENCH BY SIDEWALL DOPINGS

(75) Inventors: Yowjuang W. Liu, San Jose; Donald L. Wollesen, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/052,057

(22) Filed: Mar. 30, 1998

(51) Int. Cl.[7] .................... H01L 29/788; H01L 21/336
(52) U.S. Cl. ............................ 257/315; 438/259
(58) Field of Search ............................. 257/315; 438/259

(56) References Cited

U.S. PATENT DOCUMENTS

| 5,016,067 | 5/1991 | Mori ............................. 357/23.4 |
| 5,378,655 | 1/1995 | Hutchings et al. ............... 437/203 |
| 5,705,415 | 1/1998 | Orlowski et al. ................ 437/43 |
| 5,770,878 | 6/1998 | Beasom ......................... 257/330 |
| 5,773,343 | 6/1998 | Lee et al. ...................... 438/259 |
| 5,883,399 | 3/1999 | Yin et al. ...................... 257/66 |
| 5,953,602 | * 9/1999 | Oh et al. ...................... 438/201 |

* cited by examiner

Primary Examiner—Olik Chaudhuri
Assistant Examiner—Howard Weiss
(74) Attorney, Agent, or Firm—Fenwick & West LLP

(57) ABSTRACT

A device structure and method for a non-volatile semiconductor device comprises a trenched floating gate and a control gate and further includes a source region, a drain region, a channel region, and an inter-gate dielectric layer. The trenched floating gate is formed in a trench etched into the semiconductor substrate. The trenched floating gate has a top surface which is substantially planar with a top surface of the substrate. The source and drain have a depth approximately equal to or greater than the depth of the trench and partially extend laterally underneath the bottom of the trench. The inter-gate dielectric layer is formed on the top surface of the trenched floating gate, and the control gate is formed on the inter-gate dielectric layer. In one embodiment, the device structure also includes sidewall dopings that are implanted regions formed in the semiconductor substrate which extend substantially vertically along the length of the trench. The sidewall dopings are immediately contiguous the vertical sides of the trench and laterally separate the trench from the source region and the drain region.

12 Claims, 8 Drawing Sheets

TRENCHED GATE NON-VOLATILE SEMICONDUCTOR DEVICE WITH THE SOURCE/DRAIN REGIONS SPACED FROM THE TRENCH BY SIDEWALL DOPINGS

RELATED APPLICATIONS

The subject matter of this application is related to the subject matter of commonly assigned U.S. patent applications having the following serial numbers and titles: Ser. No. 09/052,051, "A Trenched Gate Metal Oxide Semiconductor Device and Method"; Ser. No. 09/052,058, "Trenched Gate Semiconductor Device and Method for Low Power Applications"; and Ser. No. 09/052,062, "A Trenched Gate Non-Volatile Semiconductor Device and Method with Corner Doping and Sidewall Doping", all concurrently filed herewith.

FIELD OF THE INVENTION

The present invention relates generally to semiconductor devices and methods of manufacture, and more particularly, to semiconductor devices and methods of manufacture including a trenched gate.

BACKGROUND OF THE INVENTION

Conventional semiconductor non-volatile memories, such as read-only memories (ROMs), erasable-programmable ROMs (EPROMs), electrically erasable-programmable ROMs (EEPROMs), and flash EEPROMs are typically constructed using a double-poly structure. Referring now to FIG. 1, there is shown a cross-sectional view of the device structure of a conventional nonvolatile memory device 100 including a substrate 102 of a semiconductor crystal such as silicon. The device 100 also includes a channel region 104, a source region 106, a drain region 108, a floating gate dielectric layer 110, a floating gate electrode 112, an inter-gate dielectric layer 114, and a control gate electrode 116. The floating gate dielectric layer 110 isolates the floating gate electrode 112 from the underlying substrate 102 while the inter-gate dielectric layer 114 isolates the control gate electrode 116 from the floating gate electrode 112. As shown in FIG. 1, the floating gate dielectric layer 110, the floating gate electrode 112, the inter-gate dielectric layer 114, and the control gate electrode 116 are all disposed on the surface of the substrate 102. The device structure of conventional non-volatile memory devices as shown in FIG. 1 is limited to the degree to which the active devices can be made smaller in order to increase device packing density and performance. Additionally, the stacked dual gate structure which is formed on the substrate surface is sensitive to process variations of overlaps between the floating gate and the source and drain junctions.

SUMMARY OF THE INVENTION

In accordance with the present invention, a non-volatile semiconductor device is fabricated to include a trenched floating gate and a control gate. Embodiments employing the principles of the present invention improve the device scaleability and packing density by reducing the lateral diffusion of the source and drain regions under the trenched floating gate. The corner-limiting lateral diffusion of the source and drain regions under the trenched floating gate also minimizes the process variations of overlaps between the trenched floating gate and the source and drain regions. Moreover, the present invention reduces the stacked gate height of the structure thus providing better process control and manufacturability. Furthermore, a device fabricated according to the principles of the present invention can be more efficiently programmed and erased than conventional non-volatile devices.

In one embodiment of the present invention, a device structure for a non-volatile semiconductor device includes a trenched floating gate and a control gate. The trenched floating gate is formed in a trench etched into a semiconductor substrate. The device structure further includes a source region, a drain region, and a channel region which is implanted in the substrate beneath the bottom surface of the trench. An inter-gate dielectric layer is formed on a top surface of the trenched floating gate, and the control gate is fabricated on the inter-gate dielectric layer.

In another embodiment, a device structure fabricated according to the principles of the present invention comprises a trenched floating gate, a control gate, and sidewall dopings. The sidewall dopings are formed in a semiconductor substrate having a trenched floating gate and laterally separate the trench in which the trenched floating gate is formed from the source and drain regions. The sidewall dopings are immediately contiguous the vertical sidewalls of the trench and immediately contiguous the substrate surface. The sidewall dopings reduce the coupling between the control gate and the source and drain regions and reduce leakages from the vertical sides of the trench in which the trenched floating gate is formed. Furthermore, the sidewall dopings of the present invention enhance the program and erase efficiency of the non-volatile device by contributing to higher electrical fields around the bottom corners of the gate trench where program and erase operations take place when compared to the electrical fields of prior art devices.

In accordance with one embodiment of the present invention, a trenched floating gate semiconductor device with sidewall dopings is fabricated by first etching a trench in the silicon substrate and implanting the substrate with dopant impurities to form a channel region beneath the trench. The sidewall dopings are then formed by implanting the substrate at an angle with dopant impurities. After the sidewall dopings have been formed in the substrate, a trench-to-gate insulating layer is formed inside the trench followed by a layer of polysilicon to form the trenched floating gate. The polysilicon layer is planarized until it is substantially planar with the substrate surface. An inter-gate dielectric layer is then formed on the top surface of the trenched floating gate. Next, a control gate is fabricated on the inter-gate dielectric layer, and control gate spacers are formed at the vertical side surfaces of the control gate. Finally, source and drain regions are implanted into the substrate.

DESCRIPTION OF THE PREFERRED EMBODIMENT

Figure 1:
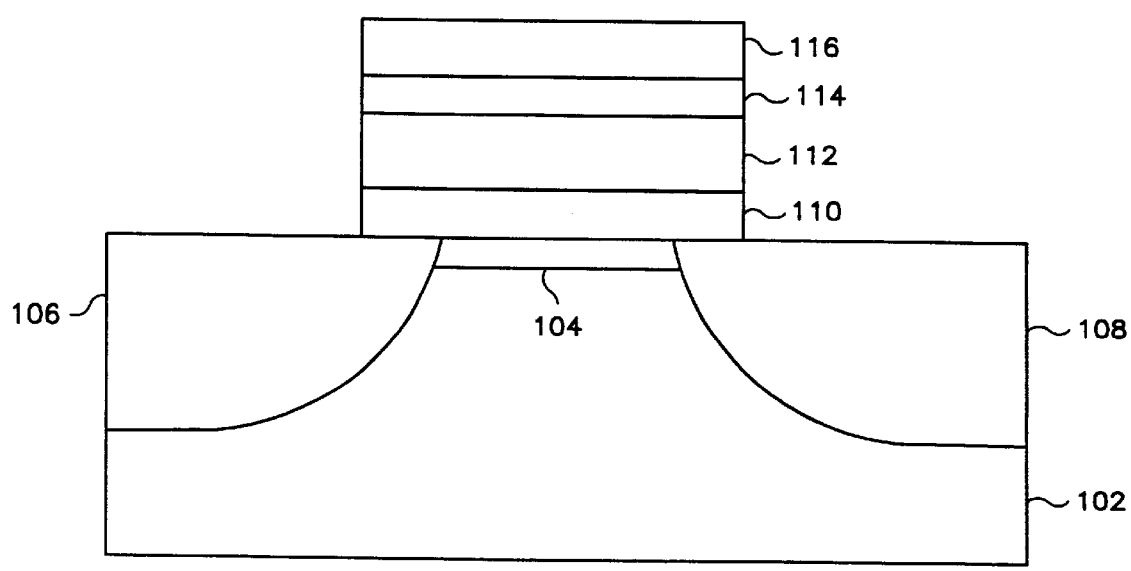
FIG. 1 is a cross-sectional view of a conventional non-volatile device.
Figure 2A:
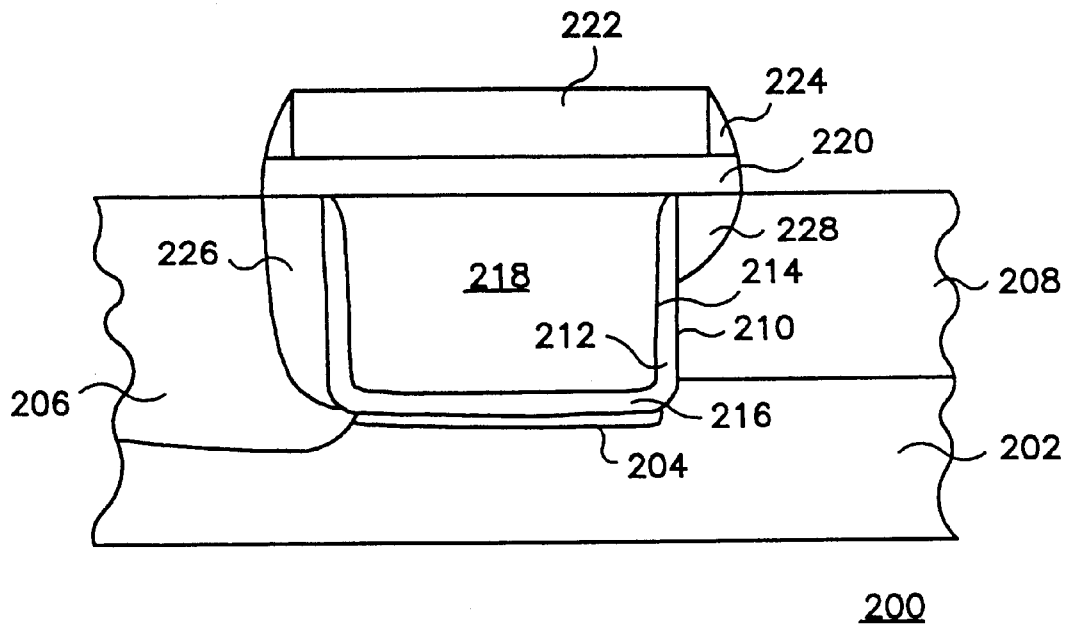
FIGS. 2A and 2B are cross-sectional views of a dual gate device embodying the principles of the present invention.

FIG. 2A is a cross-sectional view of a non-volatile device embodying the principles of the present invention. FIG. 2A shows a semiconductor structure 200 including a substrate 202 of a semiconductor crystal such as silicon, according to one embodiment of the present invention. The substrate 202 is preferably p-doped or provided with a p-well to a suitable threshold voltage level in accordance with conventional silicon semiconductor fabrication techniques. Semiconductor structure 200 also includes a channel region 204, a source region 206, a drain region 208, a trench 210, and a trench-to-gate insulating layer 212. Trench-to-gate insulating layer 212 preferably comprises a trenched gate dielectric spacer 214 formed on upright vertical sides or sidewalls inside trench 210 and a trenched gate tunneling dielectric 216 formed on the bottom surface inside trench 210. Structure 200 also includes a trenched floating gate electrode 218, an inter-gate dielectric layer 220, a control gate electrode 222, and control gate spacers 224.

Source region 206 and drain region 208 are diffusion regions of semiconductor material that are doped with impurities that have a conductivity opposite to the conductivity of substrate 202. For example, when substrate 202 is p-doped, the opposite conductivity type for source region 206 and drain region 208 is n-type. Preferably source region 206 and drain region 208 are doped with "donor" or n-type impurities of phosphorous, arsenic or the like in conventional manner with a dose range on the order of approximately $5 \times 10^{14}$; atoms $cm^{-2}$ to approximately $1 \times 10^{16}$ atoms $cm^{-2}$. Source region 206 and drain region 208 have a depth approximately equal to or greater than the depth of trench 210 and partially extend laterally underneath the bottom of trench 210 to form source and drain junctions disposed along portions of the lower sidewalls and the bottom corners of trench 210 as shown in FIG. 2A. Channel region 204 is preferably an implanted region formed beneath the bottom surface of trench 210. According to one embodiment of the present invention, trench 210 is between approximately 100 Å and 5000 Å wide and from approximately 100 Å to 5000 Å deep. Preferably, trench 210 has rounded corners at the top and bottom of the trench, and the angle of the walls of trench 210 is substantially normal to the top surface. Alternatively, the angle of the trench walls may be slightly sloped to diverge upwardly. Trench-to-gate insulating layer 212 preferably comprises a trenched gate dielectric spacer 214 formed on upright vertical sidewalls inside trench 210 and a trenched gate tunneling dielectric 216 formed on the bottom surface inside trench 210. Trenched gate dielectric spacer 214 has preferably a low dielectric constant (K) and is formed on the vertical side surfaces or sidewalls inside trench 210. Preferably, the thickness of trenched gate dielectric spacer 214 is scaled according to the width of trench 210 such that the thickness of trenched gate dielectric spacer 214 does not comprise a significant part of the dimensions of trench 210. In other words, the thickness will preferably be scaled to reduce conduction through the sidewalls of trench 210 and to be optimized for the operational voltage of the device. For example, when trench 210 is approximately 3000 Å to 5000 Å wide, trenched gate dielectric spacer 214 is preferably equal to or greater than 200 Å in order to minimize conduction at the sidewalls of trench 210 and to be optimized for the operational voltage of the device. Trenched gate dielectric spacer 214 also reduces the coupling between source region 206 and drain region 208 and trenched floating gate electrode 218. Trenched gate dielectric spacer 214 is preferably a fluorine doped thermal oxide, deposited high temperature oxide (HTO) or composited dielectric films with a K approximately equal to or less than 3.5. Trenched gate tunneling dielectric 216 is formed on the bottom surface inside trench 210 and is preferably a high K dielectric such as nitrided oxide and has a thickness which is approximately equal to or less than 100 Å. Preferably, the resultant thickness of trenched gate tunneling dielectric 216 is thinner than the thickness of trenched gate dielectric spacer 214. Trenched floating gate electrode 218 is formed over trench-to-gate insulating layer 212 and in a preferred embodiment, has a top surface which is substantially planar with a top surface of substrate 202. Trenched floating gate electrode 218 is a conductive material such as polysilicon, preferably doped with n-type material, and has a final thickness which is approximately of the same thickness as the depth of trench 210. Inter-gate dielectric layer 220 is preferably a high K dielectric material and preferably is an Oxide-Nitride-Oxide (ONO) layer. Control gate electrode 222 is a conductive material, such as polysilicon doped with n-type material or polysilicide, and is approximately 200–5000 Å thick. Control gate spacers 224 insulate control gate electrode 222 and are typically formed by first depositing a 100–2000 Å thick layer of oxide in conventional manner and then etching the oxide with a reactive ion etch (RIE). While the present invention has been described in terms of a single device structure, it should be recognized that the underlying structure of the present invention may be coupled to other device structures to form an array for a semiconductor device, such as a memory array.

One advantage of the present invention is the more planar topography of the trenched floating gate when compared to prior art non-volatile device structures. The more planar topography resulting from the reduced stacked gate height improves the process control and manufacturability of the device. The trenched gate structure also improves the device scaleability and packing density by reducing the variation of lateral diffusion of the source and drain regions under the floating gate. The diffusion of the source and drain regions disposed along portions of the lower sidewalls and the bottom of the trench is a comer-limiting diffusion process which improves the uniformity and controllability of the lateral diffusion of the source and drain regions under the trenched floating gate. This comer-limiting diffusion process is described below in more detail with reference to FIG. 3J.

Figure 2B:
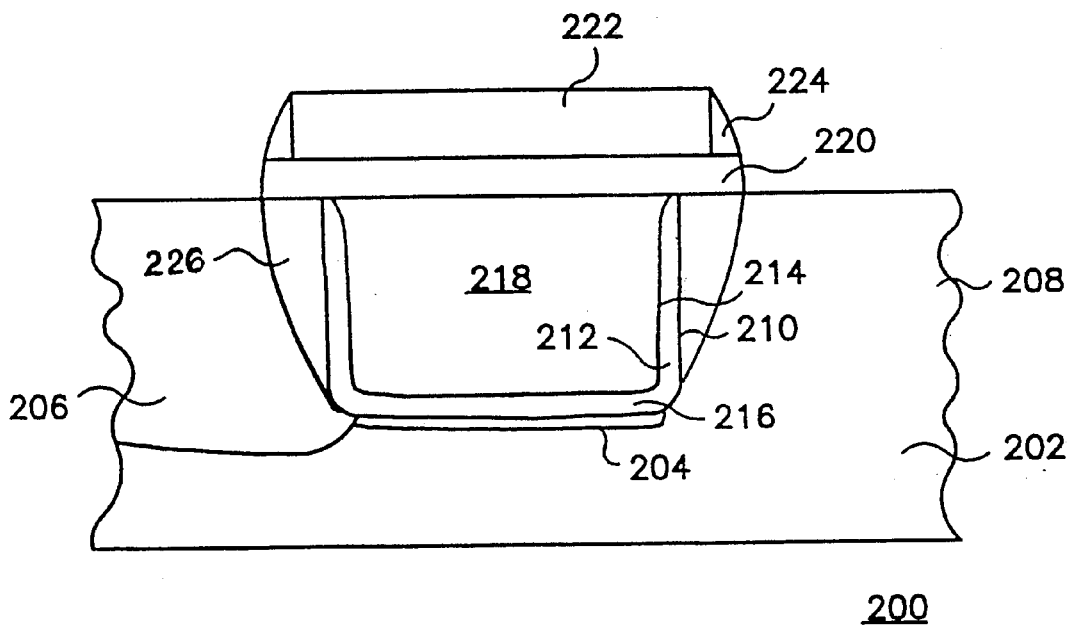

In one embodiment of the present invention, semiconductor structure 200 includes sidewall dopings 226. FIG. 2B is a cross-sectional view of one embodiment of semiconductor structure 200 with sidewall dopings 226 in accordance with the present invention. Sidewall dopings 226 are formed in the semiconductor substrate 202 and laterally separate trench 210 from the source and drain regions 206, 208. Sidewall dopings 226 are immediately contiguous the substantially upright vertical sidewalls of trench 210 and are immediately contiguous the substrate surface. Sidewall dopings 226 are preferably doped with "acceptor" or p-type impurities, such as boron, and are formed in conventional manner with an implant at approximately 15 to 75 degrees and a dose range on the order of $1 \times 10^{13}$ atoms $cm^{-2}$ to on the order of $1 \times 10^{15}$ atoms $cm^{-2}$. The width of sidewall dopings 226 is approximately equal to the width of control gate spacers 224.

The sidewall dopings 226 reduce the coupling between the source and drain regions and the control gate thus minimizing the sensitivity to misalignments between the control gate and the source and drain regions. Additionally, the sidewall dopings reduce leakages of electrons from the trenched gate electrode through the vertical sides of the trench. Furthermore, the sidewall dopings improve the program and erase efficiency by enhancing electrical fields for comer injections.

Figure 3A:
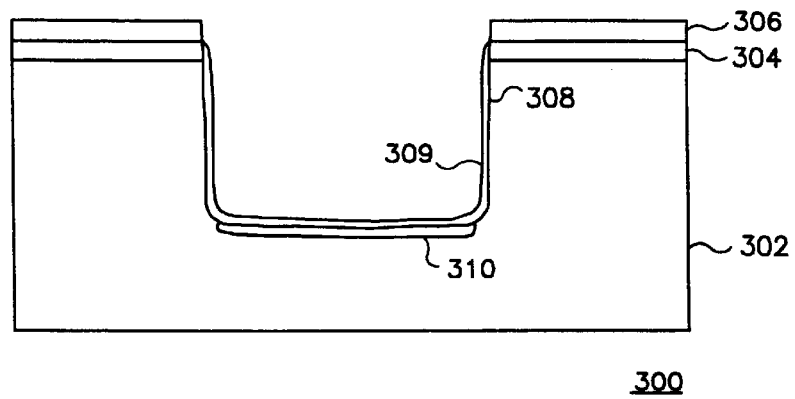
FIGS. 3A–3J are cross-sectional views of a semiconductor substrate in various stages of processing in accordance with one embodiment of the present invention.

FIGS. 3A–3J are cross-sectional views of a semiconductor substrate in various stages of processing in accordance with one embodiment of the present invention. While the present invention will now be described in terms of fabricating a single device structure, it should be recognized that the underlying process of the present invention may be employed to fabricate multiple devices on a single substrate. FIG. 3A is a cross-sectional view of a semiconductor wafer 300 comprising a substrate 302, a first pad oxide layer 304, a nitride layer 306, a trench 308, a second pad oxide layer 309, and a channel region 310. The substrate 302 is preferably a p-doped silicon substrate cut from a single silicon crystal. First pad oxide layer 304 is approximately 100 Å thick and provides stress relief between substrate 302 and nitride layer 306. Nitride layer 306 has a thickness of approximately 1500 Å and preferably comprises of silicon nitride ($Si_3N_4$). Nitride layer 306 serves as a masking layer or etch stop for subsequent oxidation, chemical-mechanical polishing (CMP), and etch. First pad oxide layer 304 and nitride layer 306 may be deposited in conventional manner by chemical vapor deposition (CVD) or other techniques. Trench 308 is formed in conventional manner using a reactive ion etch (RIE) to remove the silicon substrate. The trench etching process may include multiple steps such as a nitride etch, an oxide etch and a high selectivity silicon to oxide etch. Second pad oxide layer 309 is approximately 100 Å thick and is grown in conventional manner inside trench 308. Channel region 310 is preferably formed using ion implantation of boron in conventional manner with a dose range on the order of approximately $1\times10^{12}$ atoms $cm^{-2}$ to approximately $1\times10^{15}$ atoms $cm^{-2}$ and an energy of approximately 1 keV to 60 keV at an angle of approximately 0 degrees.

Figure 3B:
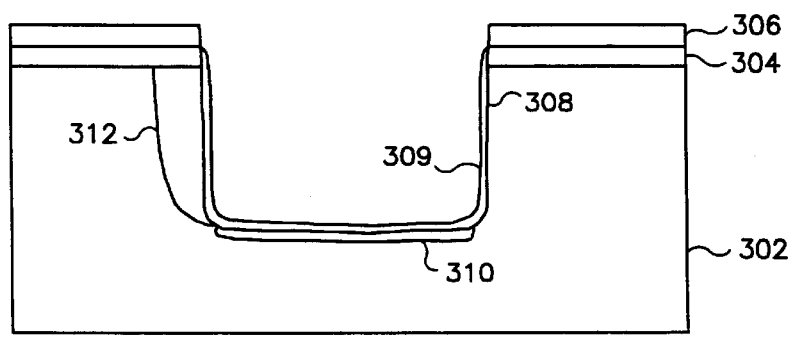

In one embodiment of the present invention, sidewall dopings are formed in the semiconductor substrate. After channel region 310 has been formed beneath the bottom surface of trench 308, semiconductor wafer 300 is implanted with dopant impurities of one conductivity type to form sidewall dopings 312. FIG. 3B is a cross sectional view of semiconductor wafer 300 following implantation of sidewall dopings 312. In one embodiment of the present invention, boron is implanted at a large angle, preferably around 15 to 75 degrees, with a dose range on the order of approximately $1\times10^{13}$ atoms $cm^{-2}$ to approximately $1\times10^{15}$ atoms $cm^{-2}$ and with an energy ranging from approximately 1 to 60 keV. Here, a large angle is meant to refer to a convention which is relative to the axis which is normal to the top surface of the substrate. In other words, 0 degrees means an implant is along the axis which is normal to the top surface of the substrate and 90 degrees means an implant which is parallel to the surface of the substrate.

Figure 3C:
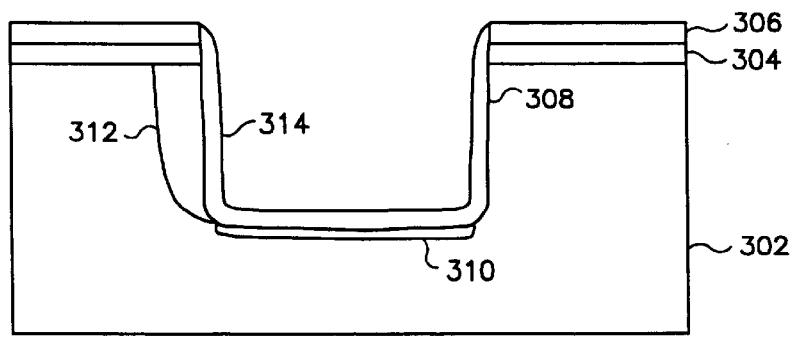

Next, a trench-to-gate dielectric layer is formed in trench 308 to isolate the trenched floating gate electrode from trench 308. The trench-to-gate dielectric layer preferably comprises a trenched gate dielectric spacer 314 and a trenched gate tunneling dielectric 316 formed in conventional manner on upright vertical sidewalls and the bottom surface inside trench 308. FIG. 3C is a cross-sectional view of semiconductor wafer 300 following formation of trenched gate dielectric spacer 314 and trenched gate tunneling dielectric 316. Preferably, second pad oxide layer 309 is removed in conventional manner before forming trenched gate dielectric spacer 314. In forming trenched gate dielectric spacer 314, a dielectric layer, such as a layer of thermally grown oxide, deposited oxide, or a combination of a thermally grown and deposited oxide preferably doped with fluorine, is first formed in trench 308. Preferably, the fluorine doped oxide has a K lower than about 3.5. The trenched gate dielectric spacer 314 is then formed on the upright vertical surfaces inside trench 308 preferably by RIE etching the trenched gate dielectric spacer 314 until it is removed from the bottom surface of trench 308 leaving the final trenched gate dielectric spacer 314 at the vertical surfaces inside trench 308. In a preferred embodiment of the present invention, a soft silicon etch is performed as a last step of the trenched gate dielectric spacer etch to remove the damaged silicon at the bottom surface of trench 308. A trenched gate tunneling dielectric 316 is then thermally grown or deposited in conventional manner over channel region 310 on the bottom surface inside trench 308.

Figure 3D:
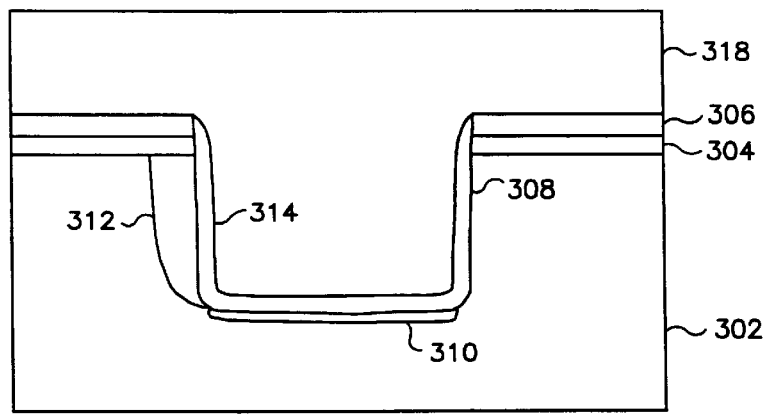

Semiconductor wafer 300 is then deposited with a layer of polysilicon 318 to form the trenched floating gate. FIG. 3D is a cross-sectional view of semiconductor wafer 300 following deposition of a layer of polysilicon 318. The thickness of polysilicon layer 318 is selected according to the depth of trench 308. In a preferred embodiment of the invention, the thickness of polysilicon layer 318 is between about 1000 Å and 10,000 Å. Typically, polysilicon layer 318 may be formed in conventional manner by low pressure chemical vapor deposition (LPCVD) and can be doped in situ in conventional manner.

Figure 3E:
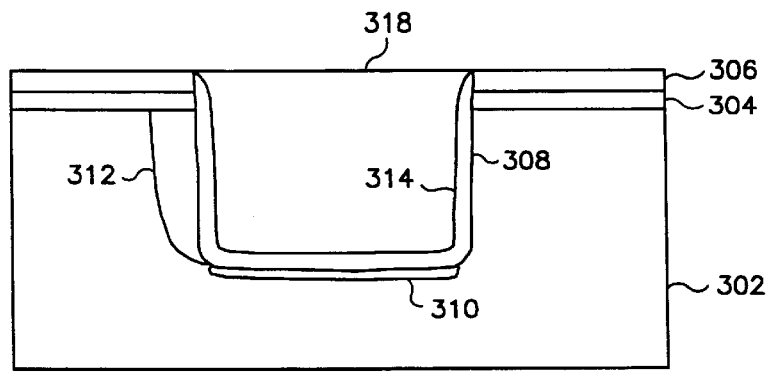
Figure 3F:
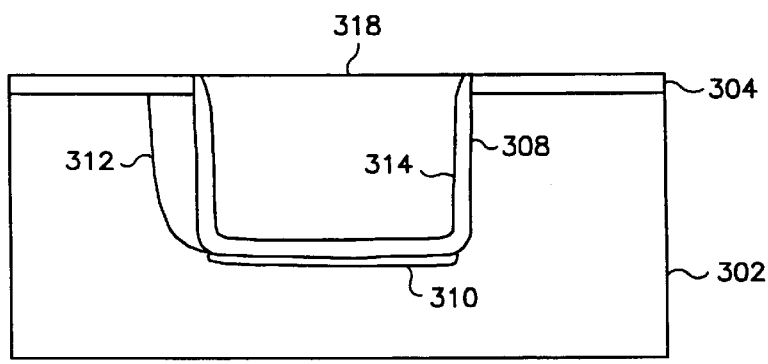

Polysilicon layer 318 is subsequently planarized to remove portions of the polysilicon. FIG. 3E is a cross-sectional view of semiconductor wafer 300 following planarization of polysilicon layer 318. Polysilicon layer 318 is planarized by using conventional techniques such as chemical-mechanical planarization (CMP). During a CMP, nitride layer 306 is used as an etch stop for the planarization process. Nitride layer 306 and a portion of polysilicon layer 318 which is above the silicon dioxide interface are then removed by a plasma etch as shown in FIG. 3F.

Figure 3G:
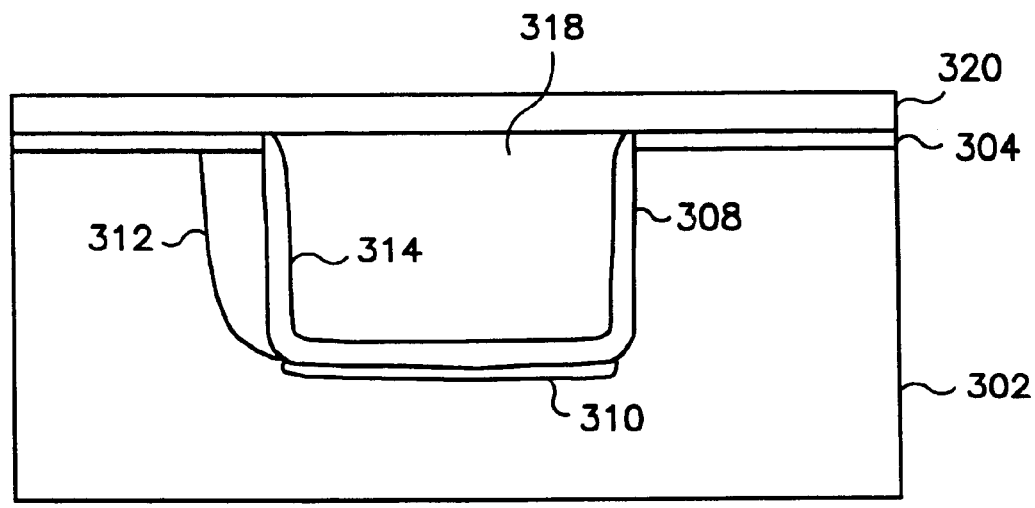
Figure 3H:
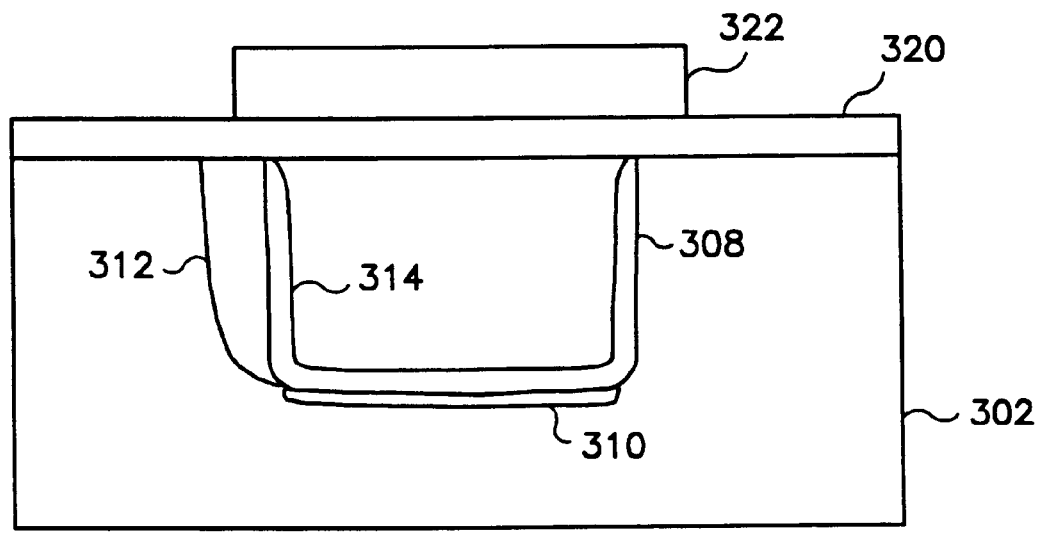

Next, an inter-gate dielectric layer 320 is deposited on the surface of polysilicon layer 318 and pad oxide layer 304. FIG. 3G is a cross-sectional view of semiconductor wafer 300 after forming inter-gate dielectric 320. The inter-gate dielectric 320 is preferably an Oxide-Nitride-Oxide (ONO) layer formed in conventional manner. After inter-gate dielectric 320 has been formed over substrate 302, a second layer of polysilicon or a layer of polysilicide 322 is deposited in conventional manner to form the control gate for non-volatile devices and is patterned using conventional photolithographic techniques. Second polysilicon or polysilicide layer 322 is etched in conventional manner using an RIE etch. FIG. 3H is a cross-sectional view of semiconductor wafer 300 after the control gate electrode has been formed. Preferably, the dimensions of the control gate should be slightly larger than the dimensions of trench 308. Alternatively, the dimensions of the control gate and the trench may be approximately equal such that they are fully aligned. The thickness of second polysilicon or polysilicide layer 322 is selected according to device vertical scaling. In a preferred embodiment of the present invention, the total thickness of second polysilicon or polysilicide layer 322 is between about 200 A and 5000 A. If polysilicon is used, it is preferably doped in situ.

Figure 3I:
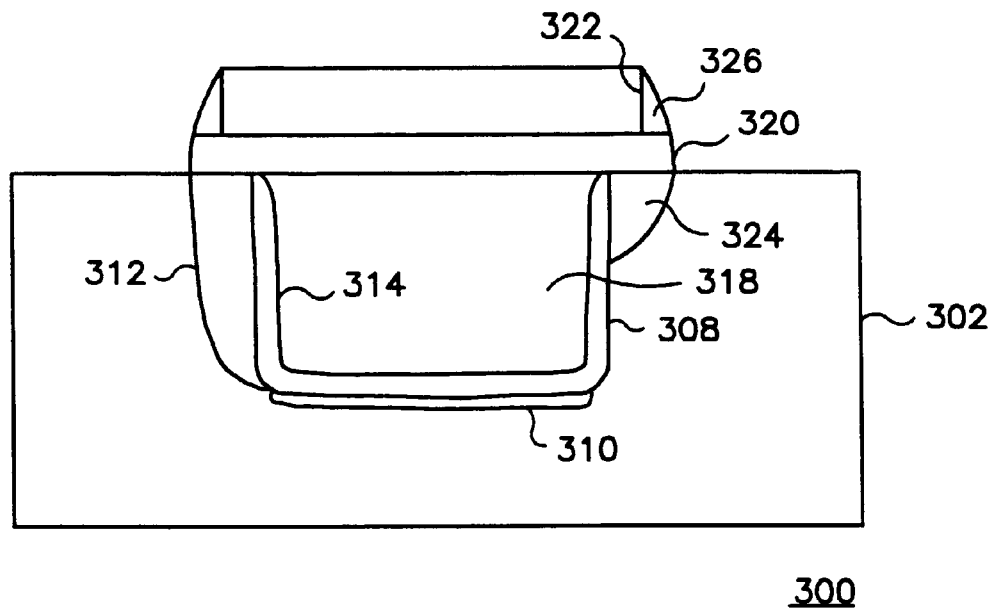

Next, control gate spacers 324 are formed at the upright side surfaces of second polysilicon or polysilicide layer 322 and on inter-gate dielectric 320. FIG. 3I is a cross-sectional view of semiconductor wafer 300 following formation of control gate spacers 324. Control gate spacers 324 are formed at the sides of second polysilicon layer 322 and on top of inter-gate dielectric 320 by depositing the spacer oxide in conventional manner over wafer 300 to between approximately 100 and 2000 Å thick. Preferably, control gate spacers 324 are formed by a RIE etching. The spacers protect and define sidewall dopings 312 of the trenched gate structure. Control gate spacers 324 also separate the control gate from the source and drain junctions for silicidation. Portions of inter-gate dielectric layer 320 which lie outside the control gate are removed during the control gate spacer etch. Inter-gate dielectric layer 320 is removed during this step so that if a misalignment occurs, inter-gate dielectric layer 320 will still insulate the trenched floating gate from the control gate.

Figure 3J:
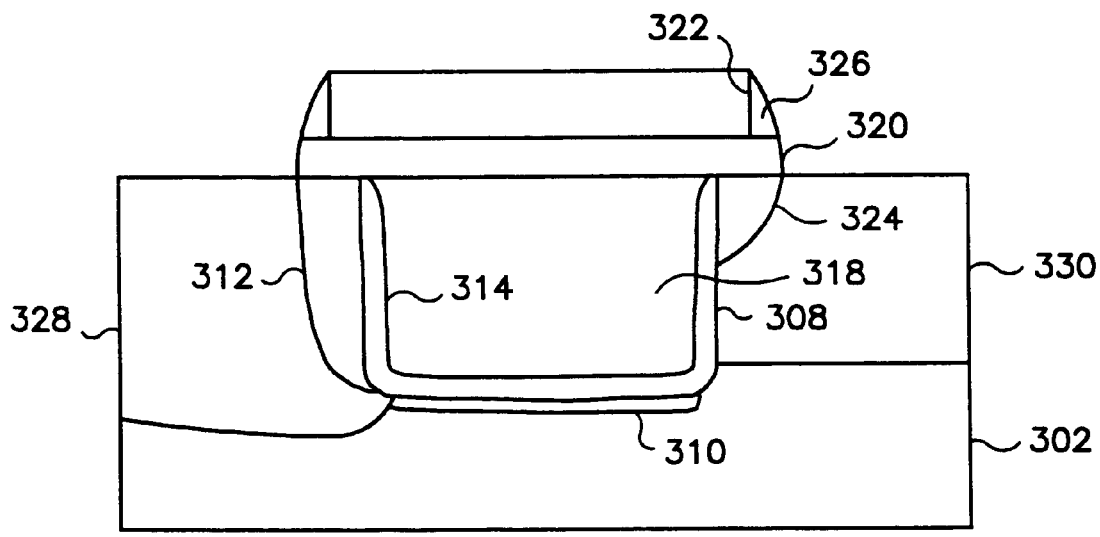

After formation of control gate spacers 324, conventional semiconductor processes are used to form source and drain regions 326, 328 as shown in FIG. 3J. Preferably, multiple ion implantations of arsenic, phosphorous or a combination of arsenic and phosphorous with a dose range on the order of $1 \times 10^{14}$ cm$^{-2}$ to on the order of $1 \times 10^{16}$ cm$^{-2}$ are performed at different implant energies. The purpose of multiple implants at different energies is to form source and drain junctions with a depth approximately greater than the depth of trench 308. Alternatively, the source and drain implant may be done through contact openings formed in the interlayer dielectric. The advantage of this alternate embodiment is that a deeper implant can be performed on the wafer with the contact mask without adversely affecting the integrity of the device. Source and drain regions 326, 328 are preferably formed using a corner-limiting diffusion process. The corner-limiting diffusion process is primarily due to the corner effects of the trench, i.e., where the lower sidewalls and bottom of the trench intersect. The source and drain implants are immediately contiguous the sidewalls of the trench with the deepest "asimplanted" dopant peak of the source and drain regions being disposed at substantially the same depth as the depth of the trench before a thermal anneal. During anneal, the lateral diffusion of the source and drain junctions beneath the bottom surface of the trench is constrained by the amount of dopants available at the bottom corner, i.e., the intersection of the lower sidewall and bottom of the trench, and by the radial nature of the diffusion process. As a result, only a low percentage of dopant diffuses around the bottom corner of the trench, thus resulting is a corner-limiting process. Finally, standard MOS processes are used to complete processing of the semiconductor device.

Figure 4A:
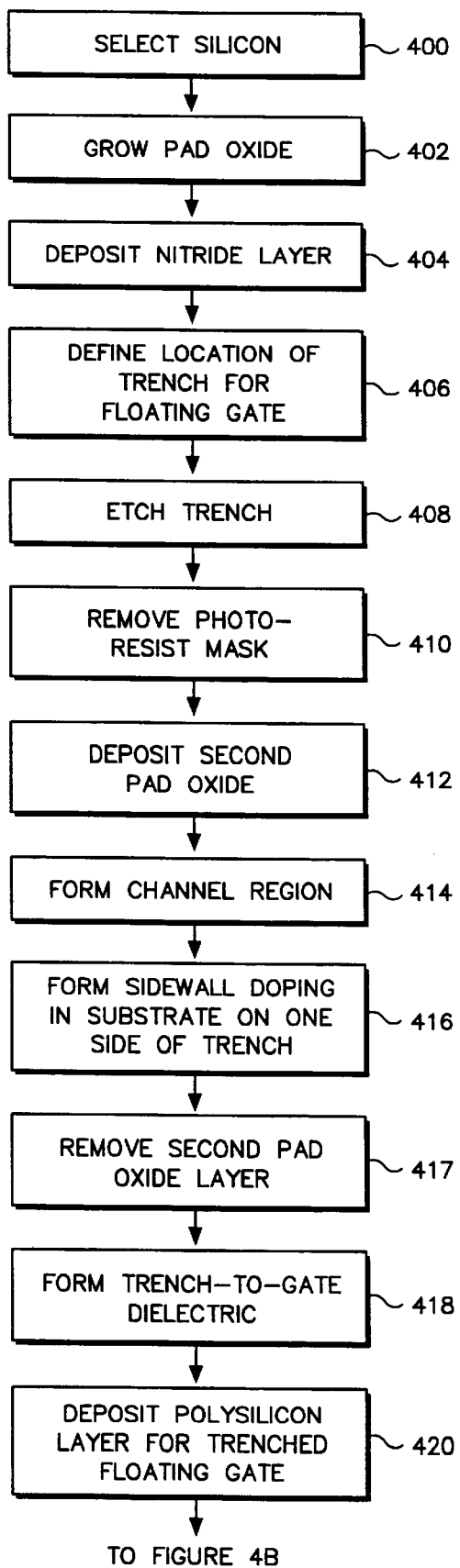
FIGS. 4A and 4B comprise a flow chart representing the stages of the manufacture according to the illustrated embodiment of FIGS. 3A–3J.
Figure 4B:
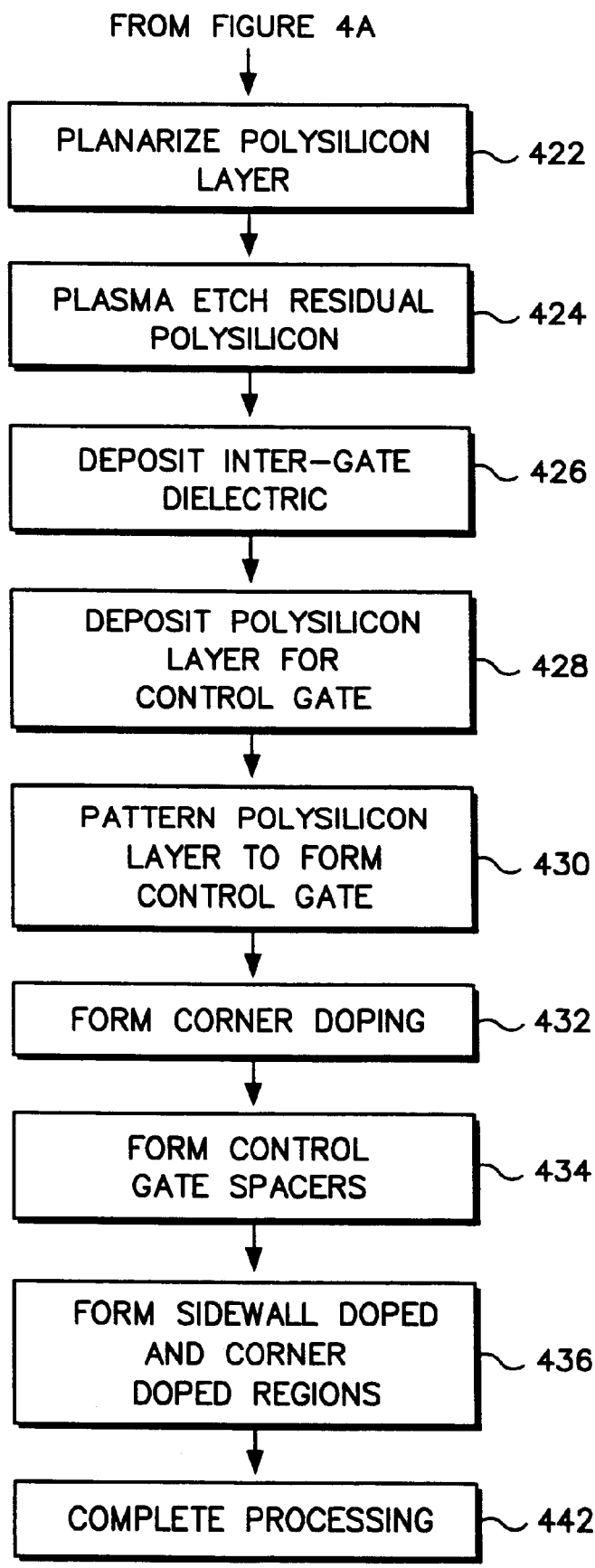

FIGS. 4A and 4B comprise a flow chart detailing one embodiment of a method of the present invention for fabricating a trenched gate semiconductor device with sidewall dopings. After a desired semiconductor substrate has been selected 400 for processing, a pad oxide layer and a nitride layer are formed 402, 404 on the substrate. This pad oxide layer and nitride layer sandwich can also be used for trench isolation (not shown) that can be easily integrated with this invention. The substrate is then masked with a photo-resist layer to define 406 the location of the floating gate trench. The exposed nitride and oxide layers and the underlying silicon substrate are etched 408 to remove the silicon substrate at the selected locations. After removal 410 of the photo-resist layer, a second layer of pad oxide is formed 412 on the substrate. Next, dopant ions for the channel region are implanted 414 using standard ion implantation techniques. The semiconductor wafer is then implanted at a large angle to form 416 the sidewall dopings. Next, a trench-to-gate dielectric layer is formed by first oxidizing or depositing 420, then etching 422 a trenched gate spacer dielectric layer to form the trench gate spacers at the vertical sides inside the trench. A trenched gate tunneling dielectric layer is then formed 424 on the bottom surface in the trench to complete the trench-to-gate dielectric layer. Thereafter, a floating gate polysilicon layer is deposited 426 over the entire substrate to fill the trench. The polysilicon is planarized 428, preferably using a chemical-mechanical polish. Plasma etch 432 is then done to remove the nitride layer and a portion of the polysilicon layer above the silicon dioxide interface. Next, an inter-gate dielectric layer is deposited 434 using conventional thermal and CVD techniques. A second layer of polysilicon or a layer of polysilicide is then deposited 436 on the substrate and patterned and etched using conventional photo-lithographic techniques to form the control gate 438. The control gate spacers are then formed 442 at the side surfaces of the control gate and on a portion of the top surface of the inter-gate dielectric layer. Finally, standard processing techniques are used to form the source and drain regions 444 and to complete processing 446 of the device.

What is claimed is:

1. A semiconductor transistor comprising:

a semiconductor substrate of a first conductivity type having a top surface;

a source region of a second conductivity type; opposite the first conductivity type in the semiconductor substrate;

a drain region of the second conductivity type spaced from the source region in the semiconductor substrate;

a trench having substantially upright vertical sidewalls and a bottom surface, at a desired depth below the top surface, formed in the semiconductor substrate intermediate the source and drain regions which are disposed at depths in the substrate approximately greater than the desired depth of the trench;

a channel region formed beneath the bottom surface of the trench and immediately contiguous the source and drain regions;

a trench-to-gate insulating layer formed in the trench;

a trench floating gate electrode formed on the trench-to-gate insulating layer inside the trench and having a top surface;

an inter-gate dielectric layer formed on the top surface of the trench floating gate electrode;

a control gate electrode formed on the inter-gate dielectric layer; and sidewall dopings of the first conductivity type disposed immediately contiguous the substantially vertical sidewalls of the trench and laterally spacing each of the source and drain regions from the trench.

2. The semiconductor transistor of claim 1, wherein the trench-to-gate insulating layer further comprises:

a trenched gate dielectric spacer formed on the substantially upright vertical sidewalls inside the trench; and a trenched gate tunneling dielectric formed on the bottom surface inside the trench.

3. The semiconductor transistor of claim 1 wherein the trench-to-gate insulating layer is thicker on the substantially upright vertical sidewalls inside the trench than on the bottom surface inside the trench.

4. The semiconductor transistor of claim 1 wherein the source region and drain region are formed by a self-limited lateral diffusion process.

5. The semiconductor transistor of claim 1 wherein the source region and drain region are each disposed contiguous portions of the sidewalls and the bottom of the trench.

6. The semiconductor transistor of claim 1 wherein the top surface of the trenched gate electrode is substantially planar to the top surface of the semiconductor substrate.

7. A semiconductor transistor comprising:

a semiconductor substrate of a first conductivity type having a top surface;

a source region of a second conductivity type opposite the first conductivity type in the semiconductor substrate;

a drain region of the second conductivity type spaced from the source region in the semiconductor substrate;

a trench having substantially upright vertical sidewalls and a bottom surface formed in the semiconductor substrate intermediate the source and drain regions;

a channel region formed in the semiconductor substrate beneath the bottom surface of the trench and immediately contiguous the source and drain regions;

a trench-to-gate insulating layer formed on the sidewalls and bottom of the trench;

a trenched floating gate electrode having a top surface and formed inside the trench on the trench-to-gate insulating layer;

an inter-gate dielectric layer formed on the top surface of the trenched floating gate electrode;

a control gate electrode formed on the inter-gate dielectric layer; and sidewall dopings of the first conductivity type disposed immediately contiguous the substantially upright vertical sidewalls of the trench and laterally spacing each of the source and drain regions from the trench;

wherein the source region and drain region are each disposed contiguous portions of the sidewalls and of the bottom of the trench.

8. The semiconductor transistor of claim 7 wherein the top surface of the trenched gate electrode is substantially planar to the top surface of the semiconductor substrate.

9. A semiconductor substrate comprising an array of multiple device structures, each device structure spaced from other device structures and comprising:

a source diffusion region of one conductivity type formed in the semiconductor substrate;

a drain diffusion region of the one conductivity type formed in the semiconductor substrate spaced from the source diffusion region;

a trench region formed in the semiconductor substrate intermediate the source and drain diffusion regions;

a first layer of insulating material formed in said trench region;

a first gate electrode disposed in the trench region and formed on the first layer of insulating material and having a top surface;

a second layer of insulating material formed on the semiconductor substrate and disposed on the top surface of the first gate electrode for electrically isolating the first gate electrode;

a second gate electrode formed on the second layer of insulating material; and sidewall dopings of a second conductivity type opposite the one conductivity type, formed in the semiconductor substrate immediately contiguous the substantially vertical sides of the trench and laterally spacing each of the source and drain regions from the trench.

10. The semiconductor device of claim 9 wherein the one conductivity type is n-type.

11. The semiconductor device of claim 9 wherein the one conductivity type is p-type.

12. The semiconductor device of claim 11 wherein the sidewall dopings comprise a first sidewall doping region and a second sidewall doping region, each of a second conductivity type opposite the one conductivity type, formed in the semiconductor substrate, with first sidewall doping region disposed between the trench region and the source region, and with said second sidewall doping region disposed between the trench region and the drain region.

* * * * *